(12) United States Patent
Duffy et al.

(10) Patent No.: US 10,832,396 B2
(45) Date of Patent: Nov. 10, 2020

(54) AND NOISE BASED CARE AREAS

(71) Applicant: KLA-Tencor Corporation, Milpitas, CA (US)

(72) Inventors: Brian Duffy, San Jose, CA (US); Martin Plihal, Pleasanton, CA (US); Santosh Bhattacharyya, San Jose, CA (US); Gordon Rouse, Dublin, CA (US); Chris Maher, San Jose, CA (US); Erfan Soltanmohammadi, San Jose, CA (US)

(73) Assignee: KLA-Tencor Corp., Milpitas, CA (US)

( * ) Notice: Subject to any disclaimer, the term of this patent is extended or adjusted under 35 U.S.C. 154(b) by 63 days.

(21) Appl. No.: 16/364,161

(22) Filed: Mar. 25, 2019

(65) Prior Publication Data
US 2020/0126212 A1 Apr. 23, 2020

Related U.S. Application Data

(60) Provisional application No. 62/792,853, filed on Jan. 15, 2019, provisional application No. 62/774,558, (Continued)

(51) Int. Cl.
*G03F 1/84* (2012.01)
*G06T 7/00* (2017.01)
*H01L 21/66* (2006.01)
*G06T 7/11* (2017.01)
*G03F 7/20* (2006.01)
*G01R 31/308* (2006.01)

(52) U.S. Cl.
CPC .......... *G06T 7/0006* (2013.01); *G01R 31/308* (2013.01); *G03F 7/70591* (2013.01); (Continued)

(58) Field of Classification Search
CPC .............. G01R 31/308; G03F 7/70591; G06T 2207/20021; G06T 2207/30148; (Continued)

(56) References Cited

U.S. PATENT DOCUMENTS 7,570,796 B2 8/2009 Zafar et al.
7,676,077 B2 3/2010 Kulkarni et al.
(Continued)

FOREIGN PATENT DOCUMENTS

KR 10-2017-0067876 6/2017

OTHER PUBLICATIONS

International Search Report and Written Opinion for PCT/US2019/056626 dated Feb. 5, 2020.

*Primary Examiner* — Said M Elnoubi
(74) *Attorney, Agent, or Firm* — Ann Marie Mewherter

(57) ABSTRACT

Methods and systems for setting up inspection of a specimen with design and noise based care areas are provided. One system includes one or more computer subsystems configured for generating a design-based care area for a specimen. The computer subsystem(s) are also configured for determining one or more output attributes for multiple instances of the care area on the specimen, and the one or more output attributes are determined from output generated by an output acquisition subsystem for the multiple instances. The computer subsystem(s) are further configured for separating the multiple instances of the care area on the specimen into different care area sub-groups such that the different care area sub-groups have statistically different values of the output attribute(s) and selecting a parameter of an inspection recipe for the specimen based on the different care area sub-groups.

34 Claims, 6 Drawing Sheets

Related U.S. Application Data filed on Dec. 3, 2018, provisional application No. 62/747,893, filed on Oct. 19, 2018.

(52) U.S. Cl.
CPC ................ *G06T 7/11* (2017.01); *H01L 22/10* (2013.01); *G06T 2207/20021* (2013.01); *G06T 2207/30148* (2013.01)

(58) Field of Classification Search
CPC ..................... G06T 7/0006; G06T 7/11; G06T 7/0002–001; H01L 22/10
See application file for complete search history.

(56) References Cited

U.S. PATENT DOCUMENTS

| | | |
|---|---|---|
| 7,877,722 B2 | 1/2011 | Duffy et al. |
| 8,126,255 B2 | 2/2012 | Bhaskar et al. |
| 8,204,296 B2 | 6/2012 | Bhaskar et al. |
| 8,611,639 B2 | 12/2013 | Kulkarni et al. |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 9,183,624 B2 | 11/2015 | Karsenti et al. |
| 9,222,895 B2 | 12/2015 | Duffy et al. |
| 9,262,821 B2 | 2/2016 | Shifrin et al. |
| 2006/0280358 A1 | 12/2006 | Ishikawa |
| 2010/0235134 A1 | 9/2010 | Xiong |
| 2014/0198975 A1 | 7/2014 | Nakagaki et al. |
| 2015/0324965 A1* | 11/2015 | Kulkarni ................ G01B 21/16 382/144 |
| 2016/0377561 A1* | 12/2016 | Ramachandran ............................ G01N 21/95607 250/307 |
| 2017/0059491 A1 | 3/2017 | Duffy et al. |

* cited by examiner

AND NOISE BASED CARE AREAS

BACKGROUND OF THE INVENTION

1. Field of the Invention

The present invention generally relates to methods and systems for setting up inspection of a specimen with design and noise based care areas. Certain embodiments relate to design and noise based care areas for applications such as wafer inspection and/or metrology.

2. Description of the Related Art

The following description and examples are not admitted to be prior art by virtue of their inclusion in this section.

Inspection processes are used at various steps during a semiconductor manufacturing process to detect defects on reticles and wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

"Care areas" as they are commonly referred to in the art are areas on a specimen that are of interest for inspection purposes. Sometimes, care areas are used to differentiate between areas on the specimen that are inspected from areas on the specimen that are not inspected in an inspection process. In addition, care areas are sometimes used to differentiate between areas on the specimen that are to be inspected with one or more different parameters. For example, if a first area of a specimen is more critical than a second area on the specimen, the first area may be inspected with a higher sensitivity than the second area so that defects are detected in the first area with a higher sensitivity. Other parameters of an inspection process can be altered from care area to care area in a similar manner.

Different categories of inspection care areas are currently used. One category is legacy care areas, which are traditionally hand drawn. With nearly most users adopting design guided inspection, very few legacy care areas are currently used. Another category is design based care areas. These are care areas derived based on heuristics on chip design patterns printed on the specimen. The user tries to look at the chip design and derive methods/scripts that will help derive care areas. There are multiple techniques and tools available to define these design based care areas. As they are derived from ground truth (chip design), they end up providing high precision, tiny care areas and also allow inspection systems to store high volumes of care areas. These care areas are important not just from a defect detection standpoint, but they are often crucial to noise suppression.

It may not always be straightforward to identify or select care areas on a specimen for inspection purposes. For example, in order to make inspection with care areas practical, similar care areas are often grouped together so that they can be inspected with the same inspection parameters. In particular, currently used methodologies of specimen inspection require users to combine different care area types to form sensitivity regions. The maximum number of regions allowed today is usually about 30. However, currently, care area grouping for detection is an expert-only manual process that typically takes a week or more. For example, combining care area types to form a region is usually performed by an applications engineer. Such manual operation with a limited amount of noise data available could be arbitrary and suboptimal. In addition, care area types are usually obtained by running different rules on a die design. Combining care area types possibly destroys design purity of the care area types.

The process for care area grouping may also or alternatively include running a substantially hot inspection, i.e., an inspection with an abnormally low threshold. The events detected by such an inspection may then be grouped based on design for the specimen proximate the events. Since the inspection is run substantially hot, the detected events are more or less entirely nuisance. Therefore, based on the results of the design based grouping of the detected events, the portions of the design that generated the most frequently detected nuisance events may be identified. New care areas that contain these "nuisance generating" patterns may be created. It can however be difficult and/or time consuming to create these. The steps described above may be repeated until care areas are sufficiently generated.

Currently, all means of assessing the performance of care areas intended for noise segmentation require human intervention and judgment. The conventional approach to care area optimization is to focus on the detection of defects (statistical outlier events) and interpret the relationship of those detected events and their associated image attributes and design characteristics with care areas. Manual data visualization tools are available to map from image noise histogram data to spatial location within the source image. Human interpretation of the noise vs. spatial relationships enables one to identify systematic behavior in noisy events. Applying judgment to the observed data allows the user to make changes to the care area generation recipe(s) and iterate until the results appear to be acceptable.

Currently used methods for generating and using care areas have, therefore, a number of disadvantages. For example, manually combining care area types to regions is cumbersome and suboptimal. In addition, combining care area types destroys design purity. In another example, further segmentation of care area types based on specimen noise is not currently possible. An automated way of combining different care area types based on noise and context statistics is also currently not available. In an additional example, limiting the number of regions creates suboptimal data for defect detection (e.g., a relatively wide MDAT noise cloud) thereby burying relatively low signal defects deep inside the noise rendering them undetectable.

Accordingly, it would be advantageous to develop systems and methods for setting up inspection of a specimen with design and noise based care areas that do not have one or more of the disadvantages described above.

SUMMARY OF THE INVENTION

The following description of various embodiments is not to be construed in any way as limiting the subject matter of the appended claims.

One embodiment relates to a system configured for setting up inspection of a specimen with design and noise based care areas. The system includes an output acquisition subsystem that includes at least an energy source and a detector. The energy source is configured to generate energy that is directed to a specimen, and the detector is configured to detect energy from the specimen and to generate output responsive to the detected energy.

The system also includes one or more computer subsystems configured for generating a care area for the specimen based on a design for the specimen. The care area defines a portion of the design containing a pattern of interest (POI). The one or more computer subsystems are also configured for determining one or more output attributes for multiple instances of the care area on the specimen. The one or more output attributes are determined from the output generated by the output acquisition subsystem for the multiple instances. In addition, the one or more computer subsystems are configured for separating the multiple instances of the care area on the specimen into different care area sub-groups based on the one or more output attributes such that the different care area sub-groups have statistically different values of the one or more output attributes. The one or more computer subsystems are further configured for selecting a parameter of an inspection recipe for the specimen based on the different care area sub-groups such that the different care area sub-groups having the statistically different values of the one or more output attributes are inspected with different values of the parameter when the inspection recipe is performed for the specimen. The system may be further configured as described herein.

Another embodiment relates to a computer-implemented method for setting up inspection of a specimen with design and noise based care areas. The method includes the generating, determining, separating, and selecting steps described above. The steps of the method are performed by one or more computer systems.

Each of the steps of the method described above may be further performed as described further herein. In addition, the embodiment of the method described above may include any other step(s) of any other method(s) described herein. Furthermore, the method described above may be performed by any of the systems described herein.

Another embodiment relates to a non-transitory computer-readable medium storing program instructions executable on a computer system for performing a computer-implemented method for setting up inspection of a specimen with design and noise based care areas. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
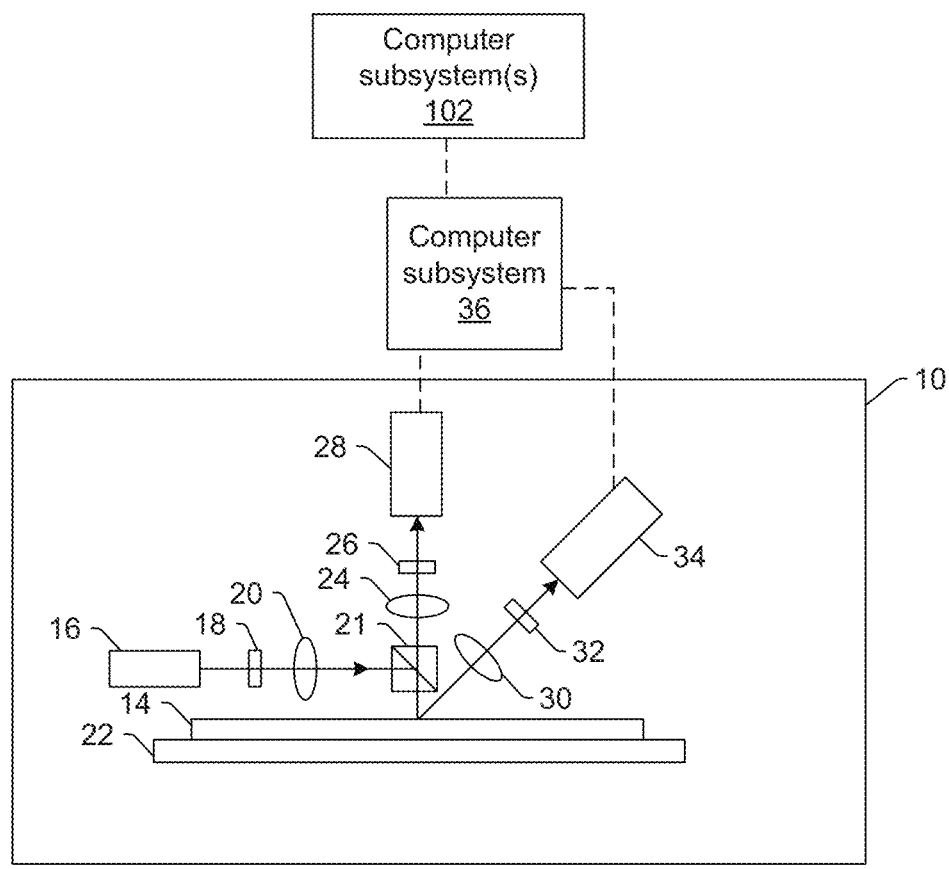
FIGS. 1 and 2 are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design" and "design data" as used herein generally refer to the physical design (layout) of an IC and data derived from the physical design through complex simulation or simple geometric and Boolean operations. The physical design may be stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files and proprietary file formats such as RDF data, which is proprietary to KLA-Tencor, Milpitas, Calif. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In some instances, simulated or acquired images from a wafer or reticle can be used as a proxy for the design. Image analysis can also be used as a proxy for design data. For example, polygons in the design may be extracted from an image of a design printed on a wafer and/or reticle, assuming that the image of the wafer and/or reticle is acquired with sufficient resolution to adequately image the polygons of the design. In addition, the "design" and "design data" described herein refers to information and data that is generated by semiconductor device designers in a design process and is therefore available for use in the embodiments described herein well in advance of printing of the design on any physical wafers.

The "design" or "physical design" may also be the design as it would be ideally formed on the wafer. In this manner, a design described herein may not include features of the design that would not be printed on the wafer such as optical proximity correction (OPC) features, which are added to the design to enhance printing of the features on the wafer without actually being printed themselves.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured for setting up inspection of a specimen with design and noise based care areas. Care area optimization is becoming increasingly difficult and important on inspection tools. In order to achieve entitlement sensitivity with defect detection algorithms like median die auto thresholding (MDAT) (with or without computed reference), which are used by some commercially available inspection tools from KLA-Tencor, it is imperative that care areas are grouped properly. Otherwise, if care areas with significantly different noise signatures are grouped together, it is generally not possible to detect defects of interest (DOIs) in the quieter care areas regardless of how "hot" the inspection runs (i.e., how sensitive defect detection is performed). In addition, care area optimization is becoming more difficult as the number of different care areas increases and the signal-to-noise ratio of DOIs decreases. The embodiments described herein automate and modify the care area optimization processes, which will dramatically reduce time to results with equivalent or better sensitivity performance.

In one embodiment, the specimen includes a wafer. In another embodiment, the specimen includes a reticle. The wafer and the reticle may include any wafer and reticle known in the art.

One embodiment of such a system is shown in FIG. 1. The system includes an output acquisition subsystem that includes at least an energy source and a detector. The energy source is configured to generate energy that is directed to a specimen. The detector is configured to detect energy from the specimen and to generate output responsive to the detected energy.

In one embodiment, the energy directed to the specimen includes light, and the energy detected from the specimen includes light. For example, in the embodiment of the system shown in FIG. 1, output acquisition subsystem 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to beam splitter 21, which directs the light to specimen 14 at a normal angle of incidence. The angle of incidence may include any suitable angle of incidence, which may vary depending on, for instance, characteristics of the specimen, the defects to be detected on the specimen, the measurements to be performed on the specimen, etc.

The illumination subsystem may be configured to direct the light to the specimen at different angles of incidence at different times. For example, the output acquisition subsystem may be configured to alter one or more characteristics of one or more elements of the illumination subsystem such that the light can be directed to the specimen at an angle of incidence that is different than that shown in FIG. 1. In one such example, the output acquisition subsystem may be configured to move light source 16, optical element 18, and lens 20 such that the light is directed to the specimen at a different angle of incidence.

In some instances, the output acquisition subsystem may be configured to direct light to the specimen at more than one angle of incidence at the same time. For example, the output acquisition subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing light having different or the same characteristics to the specimen at different or the same angles of incidence sequentially or simultaneously.

In one embodiment, light source 16 may include a broadband plasma (BBP) light source. In this manner, the light generated by the light source and directed to the specimen may include broadband light. However, the light source may include any other suitable light source such as a laser, which may be any suitable laser known in the art and may be configured to generate light at any suitable wavelength(s)

known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 1 as a single refractive optical element, it is to be understood that, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more elements of the illumination subsystem based on the type of illumination to be used for inspection, metrology, etc.

The output acquisition subsystem may also include a scanning subsystem configured to cause the light to be scanned over the specimen. For example, the output acquisition subsystem may include stage 22 on which specimen 14 is disposed during inspection, measurement, etc. The scanning subsystem may include any suitable mechanical and/or robotic assembly (that includes stage 22) that can be configured to move the specimen such that the light can be scanned over the specimen. In addition, or alternatively, the output acquisition subsystem may be configured such that one or more optical elements of the output acquisition subsystem perform some scanning of the light over the specimen. The light may be scanned over the specimen in any suitable fashion.

The output acquisition subsystem further includes one or more detection channels. At least one of the one or more detection channels includes a detector configured to detect light from the specimen due to illumination of the specimen by the output acquisition subsystem and to generate output responsive to the detected light. For example, the output acquisition subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, one detection channel is configured to detect spectrally reflected light, and the other detection channel is configured to detect light that is not spectrally reflected (e.g., scattered, diffracted, etc.) from the specimen. However, two or more of the detection channels may be configured to detect the same type of light from the specimen (e.g., spectrally reflected light). Although FIG. 1 shows an embodiment of the output acquisition subsystem that includes two detection channels, the output acquisition subsystem may include a different number of detection channels (e.g., only one detection channel or two or more detection channels). Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels may be signals or data, but not image signals or image data. In such instances, a computer subsystem such as computer subsystem 36 of the system may be configured to generate images of the specimen from the non-imaging output of the detectors. However, in other instances, the detectors may be configured as imaging detectors that are configured to generate imaging signals or image data. Therefore, the system may be configured to generate images in a number of ways.

It is noted that FIG. 1 is provided herein to generally illustrate a configuration of an output acquisition subsystem that may be included in the system embodiments described herein. Obviously, the output acquisition subsystem configuration described herein may be altered to optimize the performance of the system as is normally performed when designing a commercial inspection, metrology, etc. system. In addition, the systems described herein may be implemented using an existing inspection or metrology system (e.g., by adding functionality described herein to an existing inspection or metrology system) such as the 29xx and 39xx series of tools, the SpectraShape family of tools, and the Archer series of tools that are commercially available from KLA-Tencor. For some such systems, the embodiments described herein may be provided as optional functionality of the inspection or metrology system (e.g., in addition to other functionality of the inspection or metrology system). Alternatively, the output acquisition subsystem described herein may be designed "from scratch" to provide a completely new inspection or metrology system.

Computer subsystem 36 of the system may be coupled to the detectors of the output acquisition subsystem in any suitable manner (e.g., via one or more transmission media, which may include "wired" and/or "wireless" transmission media) such that the computer subsystem can receive the output generated by the detectors during scanning of the specimen. Computer subsystem 36 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, the different computer subsystems may be coupled to each other such that images, data, information, instructions, etc. can be sent between the computer subsystems as described further herein. For example, computer subsystem 36 may be coupled to computer subsystem(s) 102 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

Although the output acquisition subsystem is described above as being an optical or light-based subsystem, the output acquisition subsystem may be an electron beam-based subsystem. For example, in one embodiment, the energy directed to the specimen includes electrons, and the energy detected from the specimen includes electrons. In this manner, the energy source may be an electron beam source. In one such embodiment shown in FIG. 2, the output acquisition subsystem includes electron column 122, which is coupled to computer subsystem 124.

Figure 2:
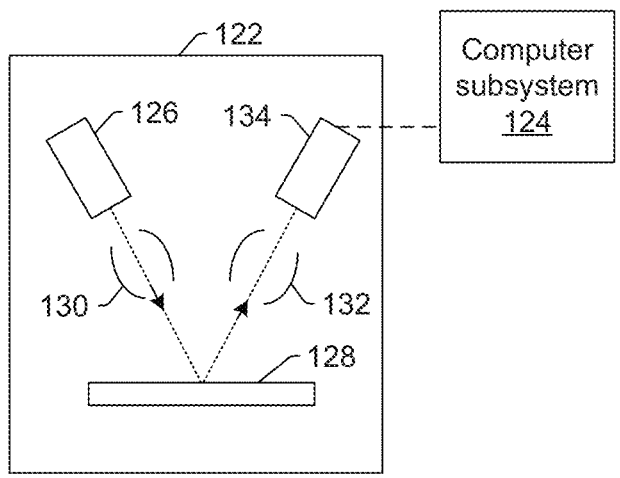

As also shown in FIG. 2, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 2 as being configured such that the electrons are directed to the specimen at an oblique angle of incidence and are scattered from the specimen at another oblique angle, it is to be understood that the electron beam may be directed to and scattered from the specimen at any suitable angles. In addition, the electron beam subsystem may be configured to use multiple modes to generate images of the specimen (e.g., with different illumination angles, collection angles, etc.). The multiple modes of the electron beam subsystem may be different in any image generation parameter(s) of the subsystem.

Computer subsystem 124 may be coupled to detector 134 as described above. The detector may detect electrons returned from the surface of the specimen thereby forming electron beam images of the specimen. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the output acquisition subsystem shown in FIG. 2 may be further configured as described herein.

It is noted that FIG. 2 is provided herein to generally illustrate a configuration of an electron beam-based output acquisition subsystem that may be included in the embodiments described herein. As with the optical subsystem described above, the electron beam subsystem configuration described herein may be altered to optimize the performance of the subsystem as is normally performed when designing a commercial inspection or metrology system. In addition, the systems described herein may be implemented using an existing inspection, metrology, or high resolution defect review system (e.g., by adding functionality described herein to an existing inspection, metrology, or defect review system) such as the eDR-xxxx series of tools that are commercially available from KLA-Tencor. For some such systems, the embodiments described herein may be provided as optional functionality of the system (e.g., in addition to other functionality of the system). Alternatively, the system described herein may be designed "from scratch" to provide a completely new system.

Although the output acquisition subsystem is described above as being a light-based or electron beam-based subsystem, the output acquisition subsystem may be an ion beam-based subsystem. Such an output acquisition subsystem may be configured as shown in FIG. 2 except that the electron beam source may be replaced with any suitable ion beam source known in the art. In one embodiment, therefore, the energy directed to the specimen includes ions. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The output acquisition subsystems described herein may be configured to generate output, e.g., images, of the specimen with multiple modes. In general, a "mode" is defined by the values of parameters of the output acquisition subsystem used for generating images of a specimen (or the output used to generate images of the specimen). Therefore, modes that are different may be different in the values for at least one of the parameters of the output acquisition subsystem. In this manner, in some embodiments, the output includes images generated by the output acquisition subsystem with two or more different values of a parameter of the output acquisition subsystem. For example, in an optical subsystem, different modes may use different wavelength(s) of light for illumination. The modes may be different in the illumination wavelength(s) as described further herein (e.g., by using different light sources, different spectral filters, etc.) for different modes. In another embodiment, different modes may use different illumination channels of the optical subsystem. For example, as noted above, the optical subsystem may include more than one illumination channel. As such, different illumination channels may be used for different modes. The modes may be different in any one or more alterable parameters (e.g., illumination polarization(s), angle(s), wavelength(s), etc., detection polarization(s), angle(s), wavelength(s), etc.) of the output acquisition subsystem.

In a similar manner, the output generated by the electron beam subsystem may include output, e.g., images, generated by the electron beam subsystem with two or more different values of a parameter of the electron beam subsystem. The multiple modes of the electron beam subsystem can be defined by the values of parameters of the electron beam subsystem used for generating output and/or images for a specimen. Therefore, modes that are different may be different in the values for at least one of the electron beam parameters of the electron beam subsystem. For example, in one embodiment of an electron beam subsystem, different modes may use different angles of incidence for illumination.

The output acquisition subsystem embodiments described herein may be configured for inspection, metrology, defect review, or another quality control related process performed on the specimen. For example, the embodiments of the output acquisition subsystems described herein and shown in FIGS. 1 and 2 may be modified in one or more parameters to provide different output generation capability depending on the application for which they will be used. In one such example, the output acquisition subsystem shown in FIG. 1 may be configured to have a higher resolution if it is to be used for defect review or metrology rather than for inspection. In other words, the embodiments of the output acquisition subsystems shown in FIGS. 1 and 2 describe some general and various configurations for an output acquisition subsystem that can be tailored in a number of manners that will be obvious to one skilled in the art to produce output acquisition subsystems having different output generation capabilities that are more or less suitable for different applications.

As noted above, the output acquisition subsystem is configured for directing energy (e.g., light, electrons) to and/or scanning energy over a physical version of the specimen thereby generating actual (i.e., not simulated) output and/or images for the physical version of the specimen. In this manner, the output acquisition subsystem is configured as an "actual" tool, rather than a "virtual" tool. Computer subsystem(s) 102 shown in FIG. 1 may, however, include one or more "virtual" systems (not shown) that are configured for performing one or more functions using at least some of the actual optical output or images and/or the actual electron beam output or images generated for the specimen, which may include any of the one or more functions described further herein.

The one or more virtual systems are not capable of having the specimen disposed therein. In particular, the virtual system(s) are not part of output acquisition subsystem 10 or electron column 122 and do not have any capability for handling the physical version of the specimen. In other words, in a virtual system, the output of its one or more "detectors" may be output that was previously generated by one or more detectors of an actual output acquisition subsystem and that is stored in the virtual system, and during the "imaging and/or scanning," the virtual system may replay the stored output as though the specimen is being imaged and/or scanned. In this manner, imaging and/or scanning the specimen with a virtual system may appear to be the same as though a physical specimen is being imaged and/or scanned with an actual system, while, in reality, the "imaging and/or scanning" involves simply replaying output for the specimen in the same manner as the specimen may be imaged and/or scanned.

Systems and methods configured as "virtual" inspection systems are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments and the one or to more computer subsystems described herein may be further configured as described in these patents.

Figure 3:
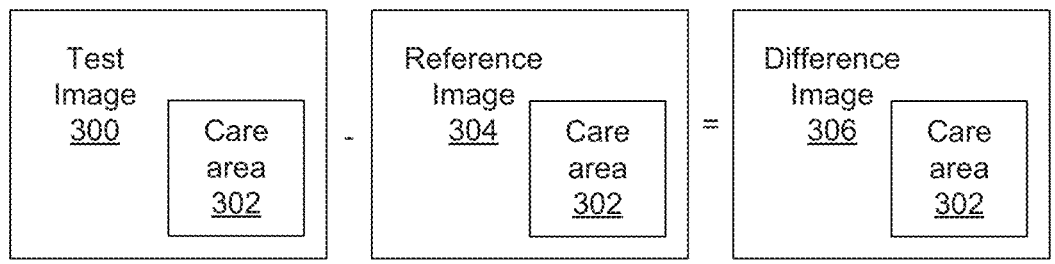
FIG. 3 is a schematic diagram illustrating a plan view of one example of a care area in different images for a specimen.

The one or more computer subsystems included in the system are configured for generating a care area for the specimen based on a design for the specimen. The care area defines a portion of the design containing a pattern of interest (POI). Care areas cover only a portion of inspection images. FIG. 3 illustrates a simplified view of the image subtraction and care area concept. As shown in FIG. 3, test image 300 may include care area 302, which covers only a portion of the test image area. In inspection, a reference image (reference image 304) may be subtracted from a test image (test image 300) to thereby generate a difference image (difference image 306), which is used for defect detection. In particular, any differences between the test and reference images will be illustrated in the difference image, and those differences can be subject to defect detection. Therefore, the test and reference images should correspond to the same portion of the design for the specimen. As such, the care area in the test image will have a corresponding care area in the reference and difference images. For example, as shown in FIG. 3, care area 302 may be located in the same position in test image 300, reference image 304, and difference image 306.

Although only one care area instance is shown in FIG. 3 at corresponding locations in the test, reference, and difference images, in reality, there are many care area instances and many different types of care areas, each including one or more care area instances. In one such example shown in FIG. 4, test image 400 may include multiple instances of care area 402, each having the same type. The test image may also include one or more instances of one or more other types of care areas (not shown). Instances of one type of care area are sometimes referred to as a "care area group," i.e., a group of care area instances all having the same care area type. Although FIGS. 3 and 4 (and other figures described herein) show examples of care areas in particular numbers and having particular characteristics, it is to be understood that the embodiments described herein are not limited in number of the care areas or care areas having any particular characteristics (size, shape, location, etc.) that can be generated and for which the steps described herein can be performed.

In one embodiment, generating the care area for the specimen based on the design includes searching the design for the POI. For example, generating the care area may include selecting one of existing rule based search (RBS) and/or pattern search recipes that may or may not be used in initial or prior setup and then using the selected recipe for generating the care area. Alternatively, the computer subsystem(s) may be configured for generating a new RBS or pattern search recipe and then using the generated recipe for generating the care area. The RBS and/or pattern search recipe may have any suitable form known in the art. For example, an RBS recipe may be generated by creating rules that describe characteristics of the POI, which can then be used to search the design for matching patterns. In general, pattern searching may include comparing the POI to different portions of the design to determine if there are matching patterns in the design.

Searching the design for the POI may also include performing a fuzzy design based grouping (DBG) or design based classification (DBC) method instead of requiring an exact match. For example, the requirements for designating two patterns to be the same may be relaxed thereby allowing for a specified degree of fuzziness. In one such example, searching for a particular POI in a design may include comparing the POI to different portions of the design and determining how similar the POI and the patterns in the different portions of the design are. Whether or not the patterns in the different portions of the design are determined to be "the same" as the POI may then be determined by comparing the degree of similarity determined by the comparison to a predetermined threshold for what is (or can be) considered to be substantially similar patterns for the embodiments described herein. Examples of suitable similarity thresholds may include 80%, 90%, or even 95% similar. The predetermined threshold may be set by a user before searching the design for the POI or may be dynamically set based on results of the comparison (e.g., where there is a clear separation between the similarities determined for different sub-populations of the different areas in the design, the threshold may be set to correspond to that separation; based on a histogram of the results of the comparisons, etc.).

In one embodiment, the one or more computer subsystems include a computer subsystem of an electronic design automation (EDA) tool. For example, for care area generation from design, the computer subsystem(s) may use EDA physical design analysis tools or apply custom algorithms to the physical design. In some such instances, a design clip or another representation of the POI may be used to analyze the design for different instances of the POI. In one such example, for care area generation from design, an algorithm may automatically segment the design into different portions that contain a POI. The EDA tool may include any suitable commercially available EDA tool. In some such embodiments, one or more of the computer subsystems described herein (e.g., computer subsystem(s) 102) may be configured as an EDA tool. In addition or alternatively, one or more steps described herein may be performed by an EDA tool or using EDA recipes with refinements for the capabilities described herein (and/or for automation of the capabilities described herein).

Since design-based care areas (i.e., care areas that are generated based on the design) are generated based on POIs, at least some of the patterns or patterned features included in each instance of a care area on a specimen are known and are the same in each instance. Therefore, since the same patterns or patterned features will affect energy (e.g., light, electrons) incident thereon in the same fashion, it was previously assumed that different instances of the same care area on a specimen would exhibit similar energy responses (e.g., light scattering, light reflecting, etc.) measured and used for inspection, metrology, or other such purposes. However, it has now become clear to the inventors that different instances of a care area on a specimen can exhibit different energy responses even though they contain at least some of the same patterns or only the same patterns (e.g., due to noise sources on the specimen that vary from care area instance to care area instance or at least for some care area instances). Therefore, although design-based care areas can help with invariant aspects of image behavior, the embodiments described herein are configured to address specimen to specimen and within specimen variation in the image behavior of care areas.

The embodiments described herein have been created to deal with such variation in the output responsive to energy from the care areas on the specimen. For example, as described further herein, the embodiments can be used to optimize the care areas for both design and output variation and/or to optimize an inspection performed using the care areas. The embodiments described herein can also be used to verify that care groups meet the objective for homogenous noise characteristics. In addition, the embodiments described herein can be used to provide clues on how to optimize an individual care area instance and/or a group of care area instances that are not homogenous. Furthermore, the embodiments described herein can ultimately automate the process of optimizing for noise homogeneity.

The computer subsystem(s) are configured for determining one or more output attributes for multiple instances of the care area on the specimen. The one or more output attributes are determined from the output generated by the output acquisition subsystem for the multiple instances. The multiple instances may be located in one die on the specimen or multiple dies on the specimen. Determining the one or more output attributes may include simply identifying which of the output attributes generated by the detector or another element of the system corresponding to each of the multiple instances of the care area for which this step is being performed. For example, if the detector or another element of the system reports gray level intensity as a function of pixel, the determining step may include identifying which of the gray level intensity values correspond to any one of the multiple instances of the care area. However, determining the output attribute(s) may include determining one or more values for the care area instances that are not generated by the detector or another element of the system. For example, the computer subsystem(s) may use the output generated by the detector to determine any attribute(s) of that output that may be useful in the embodiments described herein. Several such examples are described further herein.

In one embodiment, at least one of the one or more output attributes is a noise attribute. In another embodiment, the output attribute(s) include gray level variation in difference images generated for different instances of the care areas. Using an output attribute of difference images may be suitable in the embodiments described herein when the defect detection method that will be used to detect defects on the specimen uses difference images. However, the care area optimization described herein can support different defect detection algorithms and sensitivity region counts. For example, the computer subsystem(s) may vary the database schema and job parameters (both of which are described further herein) with detection job type, which will provide flexibility to determine and store different attributes for different detection algorithm types. The output attribute(s) used in the embodiments described herein may also include any output generated by the output acquisition subsystem or any characteristics of such output. For example, the output characteristics may be any image based characteristics that can be determined from output generated by the output acquisition subsystem. In addition, even though some embodiments may be described herein with respect to "noise" or "noise behavior" or another similar term, it is to be understood that any appropriate output attribute(s) can be used in any of the embodiments described herein. The noise attribute may be determined in any manner and may include any noise-related attribute of the output.

In another embodiment, the output from which the one or more output attributes are determined is output generated by the detector for the specimen. In this manner, the computer subsystem(s) may be configured for using the inspector (or other output acquisition subsystem) to collect a new type of data for the purpose of refining/optimizing care areas. The output itself may therefore be actual output rather than simulated output (or output that is calculated rather than generated using an actual detector). Although the embodiments described herein could be performed with (or use) output that in of itself is simulated or calculated (rather than generated with an actual detector and a physical specimen), using output that is in of itself generated by a detector and a physical specimen will be the most practical and useful for the embodiments described herein.

The one or more computer subsystems may be configured for acquiring the output from which the one or more output attributes are determined. Acquiring the output may be performed using one of the output acquisition subsystems described herein (e.g., by directing light or an electron beam to the specimen and detecting light or an electron beam from the specimen). In this manner, acquiring the output may be performed using the physical specimen itself and some sort of output acquisition (e.g., imaging) hardware. However, acquiring the output does not necessarily include imaging the specimen using imaging hardware. For example, another system and/or method may generate the output and may store the generated output in one or more storage media such as a virtual inspection system as described herein or another storage media described herein. Therefore, acquiring the output may include acquiring the output from the storage media in which it has been stored.

In some embodiments, the output from which the one or more output attributes are determined is output generated with more than one mode of the output acquisition subsystem for the specimen. For example, multimodal noise and context information may be used for the care area segmentation step(s) described further herein. Segmenting the care area as described herein using multimodal noise and context information may be beneficial for multi-mode inspection. The multiple modes of the output acquisition subsystem may include any of the modes described further herein.

In an additional embodiment, the computer subsystem(s) are configured for selecting the multiple instances of the care area for which the output attribute(s) are determined by sampling fewer than all of the multiple instances of the care area on the specimen. For example, the computer subsystem(s) may treat a sample of care area instances as defects by forcing the output to be collected in one of the various ways described herein. The computer subsystem(s) may accumulate statistics across frames for the output attribute(s). The computer subsystem(s) may store the statistics to be accumulated as a handful of attributes for the "forced events." The computer subsystem(s) may not store the accumulated statistics with the output (e.g., images), instead only storing the selected output attribute statistics in order to more easily store the statistics for a higher number of care area instances.

Collecting output attribute(s) at each care area instance may be prohibitive and unnecessary. Instead, the computer subsystem(s) may preferably determine the behavior of the care area instances from fewer than all of the care area instances on the specimen. Sampling may be performed in a variety of ways. For example, the computer subsystem(s) may perform the sampling by generating an initial sample of care area instances, eliminating any of the care area instances for which the output attribute(s) are determined to be outliers, and down sampling from the remaining instances. Thus, two pass output generation may make sense. The first pass may be performed for defect or outlier detection, and the second pass may be performed for non-defective care area instance sampling. The computer subsystem(s) may be configured to determine an initial sample of the remaining instances by analyzing the care area instance count of each care area type per die and number of dies on the specimen. The sample is preferably sufficiently large to allow both die-level and specimen-level noise analysis. The sample size estimate may also be relatively generous (e.g., more statistics than needed for analyzing noise-homogenous care areas) to allow for noise-based splitting of care area instances or a single care area into sub-care areas. The computer subsystem(s) may also generate the sample itself by a mix of random and spatially diversified sampling within each care area. The sampling may be also or alternatively performed as described herein.

In one such embodiment, the sampling is performed based on expected die level variation in the one or more attributes, and the computer subsystem(s) are configured for determining actual die level variation in the output attribute(s) for the care area based on the determined one or more output attributes. For example, the sample is preferably sufficiently large to allow die-level noise analysis. In one such example, the computer subsystem(s) may estimate expected die level variation based on empirical (prior measurements) and/or theoretical data (e.g., from modeling), determine appropriate characteristics (e.g., frequency, location, spacing, etc.) of the care area sample based on such expected die level variation, and then selecting the care area instances from all of the care area instances based on those characteristics. Determining the actual die level variation in the output attribute(s) for the care area may be performed in any suitable manner.

In another such embodiment, the sampling is performed based on expected specimen level variation in the output attribute(s), and the computer subsystem(s) are configured for determining actual specimen level variation in the output attribute(s) for the care area based on the determined one or more output attributes. For example, the sample is preferably sufficiently large to allow specimen-level noise analysis. These steps may be performed as described above with respect to die level variation.

The computer subsystem(s) are configured for separating the multiple instances of the care area on the specimen into different care area sub-groups based on the one or more output attributes such that the different care area sub-groups have statistically different values of the one or more output attributes. "Statistically different" values, as that term is used herein, may be used interchangeably with the term "significantly different" values. The term "statistically different" values, as used herein, is intended to have the commonly accepted definition of the term used in the art of mathematics and in particular statistics, i.e., statistically different is commonly accepted to mean "outside the margin of error" and "caused by something other than chance." Both of these definitions are consistent with the use of the term herein. Whether or not values of the one or more output attributes are "statistically different" can be determined, for example, by comparing the differences in the values to the margin of error and determining that differences outside the margin of error are "statistically different." Different values of the one or more output attributes are therefore "statistically similar" when the differences are within the margin of error.

Separating the multiple instances of the care area may be performed in a supervised or unsupervised manner. If the separating is unsupervised, a predetermined number of care area sub-groups may be required as input depending on the algorithm used.

The embodiments described herein may therefore trigger a split of instances of an existing care area into multiple care area sub-groups based on variation in the output attribute(s). For example, all of the instances of a care area on a specimen may be split into different sub-groups when the output attribute(s) determined for the care area instances vary significantly across a die. In another example, as described further herein, splitting all of the care area instances into different care area sub-groups may be context driven. In this manner, a non-optimized care area may include multiple sub-populations of care area instances that exist based on noise metrics. Therefore, optimizing the care area entails separating these sub-populations into their own care area sub-groups based on the care area noise metrics.

Figure 4:
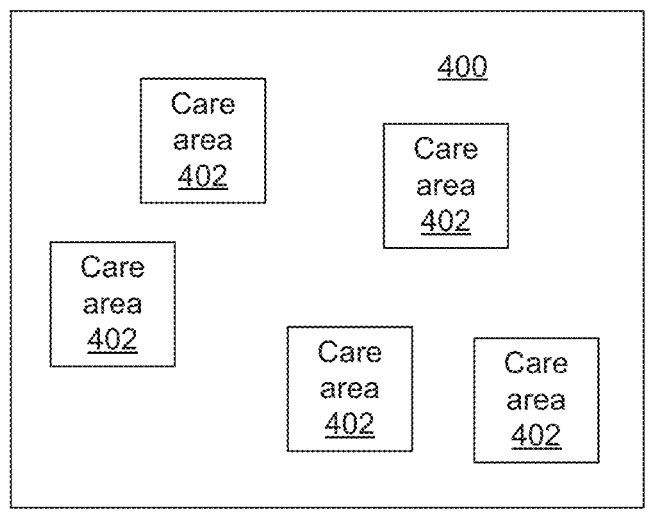
FIG. 4 is a schematic diagram illustrating a plan view of one example of multiple instances of a care area in an image for a specimen.
Figure 5:
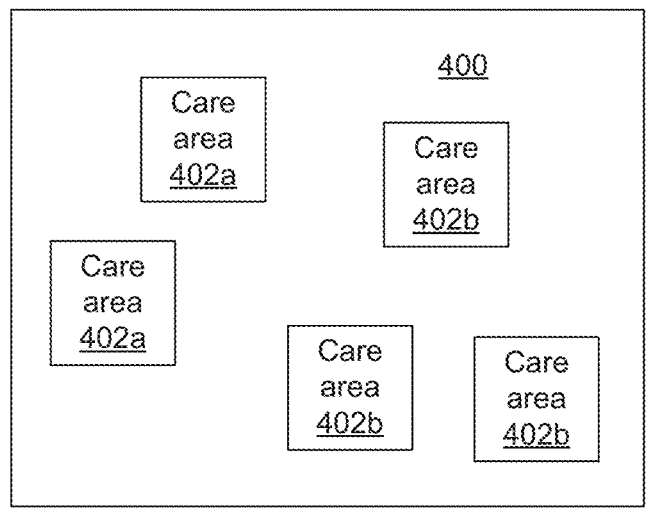
FIG. 5 is a schematic diagram illustrating a plan view of one embodiment of the multiple instances of the care area shown in FIG. 4 separated into different care area sub-groups as described herein.

In one such embodiment, the multiple instances of care area 402 shown in image 400 in FIG. 4 may be separated into different care area sub-groups as described herein. For example, the care area instances may be separated into two care area sub-groups, and, as shown in FIG. 5, one sub-group may include care area instances 402*a* and another sub-group may include care area instances 402*b*. In this manner, one group of care area instances that includes multiple instances of the same type of care area is divided into two sub-groups of care areas, each of which includes one or more instances of the same type of care area. The care area instances may be partitioned based on difference image statistics or any other output attribute(s) described herein.

In one embodiment, the computer subsystem(s) are configured for determining the output attribute(s) as a function of position within the care area for one or more of the multiple instances of the care area on the specimen and separating the care area into two or more different sub-care areas based on the one or more output attributes as the function of the position such that the two or more different sub-care areas have statistically different values of the one or more output attributes. For example, the embodiments described herein may trigger a split of a single instance of an existing care area into multiple sub-care areas based on variation in the output attribute(s) across the single instance of the existing care area. The computer subsystem(s) may perform within care area instance splitting when there is significant systematic pixel level variance, which may be tied to the layout. In this manner, a non-optimized care area instance may include multiple sub-populations of sub-care areas (e.g., different populations of pixels) that exist based on pixel noise metrics. Therefore, optimizing a care area instance entails splitting an "impure" care area instance into multiple homogenous sub-care areas.

Figure 6:
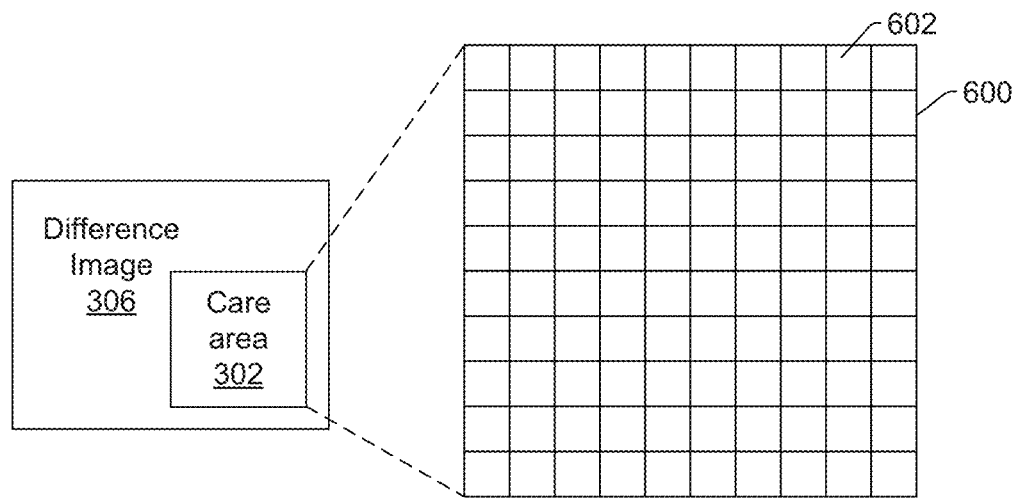
FIG. 6 is a schematic diagram illustrating the plan view of the care area in the difference image of FIG. 3 and an exploded view of the care area.

In one such embodiment, as shown in FIG. 6, difference image 306 includes care area 302, both of which may be configured as described herein. Exploded view 600 of the care area shown in FIG. 6 shows different pixels 602 within the care area. In other words, the portion of the difference image corresponding to the care area may include multiple pixels. Portions of other images described herein corresponding to the care area may also include multiple pixels. The number of pixels within any of the images described herein may vary depending on the configuration of the output acquisition subsystem and/or the size of the care area. For example, the pixels in the images may correspond to pixels in the detector(s) of the output acquisition subsystem and the care area may include a portion of the pixels in the images. In this manner, output may be generated for each pixel in the care area. Attribute(s) for the output generated for each pixel in a care area instance may be determined as described herein and may include any of the output attribute(s) described herein.

Figure 7:
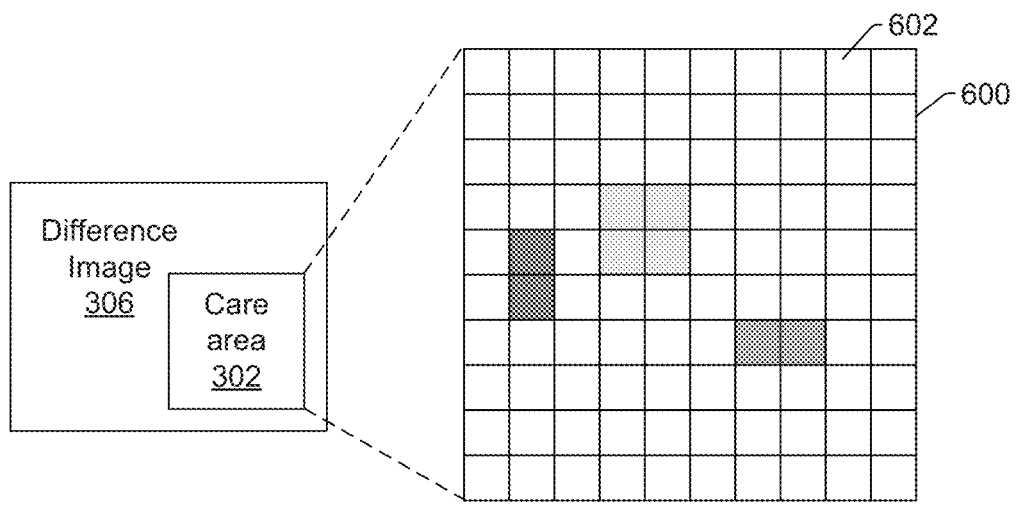
FIG. 7 is a schematic diagram illustrating the plan view of the care area in the difference image of FIG. 3 and the exploded view of the care area of FIG. 6 with one example of positions in the exploded view of the care area determined as described herein to have statistically different values of one or more output attributes.

In some instances, different portions (e.g., different pixels) in a care area instance will have statistically different values of the output attribute(s). For example, the unshaded pixels shown in FIG. 7 may be determined to have value(s) of the output attribute(s) that are statistically different than the value(s) of the output attribute(s) that are determined for the shaded pixels shown in that figure. In addition, differently shaded pixels shown in FIG. 7 may be determined to have value(s) of the output attribute(s) that are statistically different. Therefore, as shown in FIG. 7, the output attribute(s) determined for different pixels within a care area instance may have values that are statistically different. As such, a care area instance for a difference image (or any of the other images described herein) can be characterized by statistics describing the values of pixels within it. The statistics may include the mean, range, median, mode, standard deviation, and any other statistics described herein or known in the art.

Figure 8:
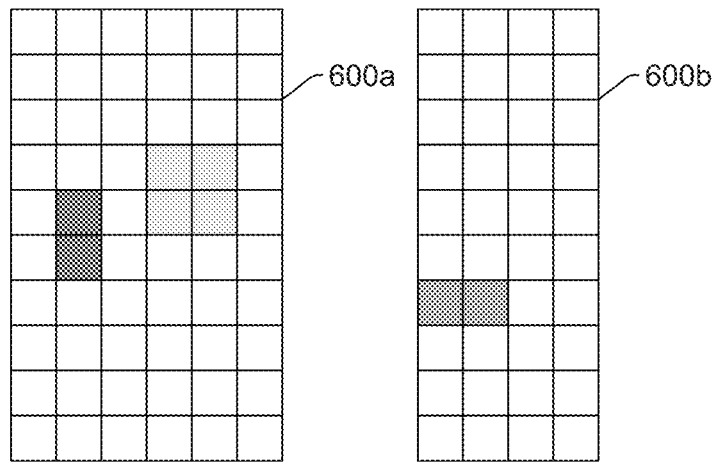
FIG. 8 is a schematic diagram illustrating a plan view of one embodiment of the exploded view of the care area of FIG. 7 separated into different sub-care areas as described herein based on the one or more output attributes as a function of position.

Since different pixels in the portion of the difference image corresponding to the care area are determined to have statistically different values of the output attribute(s), the computer subsystem(s) may separate the care area shown in FIG. 7 into multiple sub-care areas. For example, the computer subsystem(s) may separate the pixels shown in exploded view 600 of the care area into sub-care 600*a* and sub-care area 600*b*, as shown in FIG. 8, based on the output attribute(s) determined for the pixels. In this manner, if the statistical or other values of the output attribute(s) indicate that it would be appropriate to sub-divide a care area instance into multiple sub-care areas, the computer subsystem(s) may sub-divide the care area at the instance level. Although the care area is shown in FIG. 8 as separated into two sub-care areas, any care area instance may be separated into any number of sub-care areas up to a maximum of the number of pixels in the care area (where each pixel is designated as a sub-care area). However, when sub-dividing any one care area instance, it may be practical to limit the number of sub-care areas to a much lower number (e.g., 2 to 4 sub-care areas per care area instance).

In another embodiment, generating the care area is performed using a first predetermined method, and the computer subsystem(s) are configured for generating another care area for the POI with a second predetermined method, performing the determining and separating steps for the other care area, and selecting the first or second predetermined method for generating additional care areas based on results of the determining and separating steps performed for the care area and the other care area. For example, the computer subsystem(s) may perform image-based test(s) of the care areas for sufficiency. Such testing may include the determining and separating steps described herein to evaluate the noise homogeneity of the care areas or such testing may include any other image-based testing suitable for care areas. In one such example, the image-based test for sufficiency may include collecting specimen image data from a sample of pre-existing care areas that may need refinement, annotating the data with design context data (which may be from diverse/comprehensive sources), and performing statistical analysis (e.g., multi-dimensional clustering) on the combination of specimen and context data.

If the image-based testing determines that the care areas are not sufficient, the computer subsystem(s) may infer an EDA recipe selection and/or inputs for refinement. For example, in the embodiment described above, the computer subsystem(s) may try a brute force method that includes regression testing existing EDA recipes to see if they resolve the noise "pollution" (i.e., inhomogeneity and/or unresolvable noise issues) in the previously generated care areas. The regression testing may be performed in any suitable manner known in the art. In this manner, the computer subsystem(s) may perform different existing EDA recipes to generate different sets of care areas, evaluate the image-based sufficiency of each set of care areas using the determining and separating steps described herein, and then use the best set of care areas for the specimen and/or the EDA recipe that is determined to produce the best care areas to generate additional care areas for the specimen and/or other specimens. In this manner, the computer subsystem(s) may be configured for inferring design search rules to determine care areas from a statistical analysis of image and design data.

In some embodiments, the computer subsystem(s) are configured for modifying a method used for generating the care area by inferring one or more modified parameters for the method from statistical analysis of the one or more output attributes determined for the multiple instances. For example, the computer subsystem(s) may perform image-based test(s) of the care areas for sufficiency. Such testing may be performed as described above. If the image-based testing determines that the care areas are not sufficient, the computer subsystem(s) may infer an EDA recipe selection and/or inputs for refinement. For example, in this embodiment, the computer subsystem(s) may try inference (which may be tried if testing of the existing recipes as described above does not find an existing EDA recipe that produces acceptable care areas). In this embodiment, the computer subsystem(s) may apply data mining techniques to a pre-generated context database to isolate a basis for care area group splitting. The data mining techniques may be performed using any suitable machine learning technique known in the art. The machine learning/data mining may segment generated care areas into minute care areas without restriction on the minimum size of the segmented care areas. The machine learning may then characterize the segmented care areas and cluster them accordingly based on similarities in noise and design thereby creating groups of care areas that can be used in the inspection recipe. In this manner, the computer subsystem(s) may be configured for using machine learning modeling techniques for inferring the existence of multiple populations in an image noise data set.

The computer subsystem(s) may perform the data mining described above using a database for care area search rule inference that may be generated by the computer subsystem(s) described herein. The database may include a column for care area instance ID, which may include an event ID and coordinates of the care area instances. The database may also include one or more columns for empirical data, examples of which include, but are not limited to, inspection attribute(s), review attribute(s), and image noise attribute(s). The database may further include one or more columns for context data, which may include one or more of a geometric hashcode, a shape based grouping label, a design based classification code, and a rule-based search specification ID. The context data may include design context values that are spatially coincident with the event IDs of the care area instances.

The computer subsystem(s) may also use such a database to sample the care areas for the determining step described herein. For example, it may be prohibitive to exhaustively collect noise data for every care area instance. Instead, the computer subsystem(s) may profile the design for differences in the design and/or design context. Based on the design, the layout of the design on the specimen, and the inspection recipe scanning parameters, the computer subsystem(s) can also determine where each frame image will be. In this manner, the computer subsystem(s) can tile a chip into frames (wherein a frame is a portion of the inspection data that is processed collectively at the same time). The computer subsystem(s) may then choose which frames to analyze as described herein. The computer subsystem(s) may generate a sub-sample of the frames by predicting which ones you can learn the best information from. Therefore, the computer subsystem(s) may use only a portion of all of the frame images corresponding to all of the instances of a care area in a design and/or on the specimen to determine the output attribute(s) as described herein. Based on how many frames there are of each type of care area, the computer subsystem(s) can generate statistically sound data by selecting an appropriate number and/or distribution of the care area instances for which the determining step is performed. The computer subsystem(s) can then use the statistically sound data to predict (e.g., extrapolate, interpolate, etc.) statistically sound output attribute(s) for non-sampled care area instances. In addition, care area instance sampling may generate care area group meta-data, which can be used to predict care area summary data by frame and/or swath from the determined one or more output attributes.

In a further embodiment, another care area generated for the specimen based on the design defines a different portion of the design containing a different POI, and the computer subsystem(s) are configured for determining if the determining and separating steps are performed for the other care area based on results of the determining and separating performed for the care area. This step may be performed by leveraging shape based grouping (SBG) hierarchy. Such a hierarchy may include sensitivity regions (same detection threshold) at the top, followed by complexity grouping (performed based on similar complexity), primitive grouping based bins (based on similar primitives), and finally design based grouping bins (based on exact matches of patterns). If care area group noise statistics are not homogenous, the SBG hierarchy offers one natural diagnosis path for decomposing the care area group and testing for the root cause. If a source of care area group noise statistics inhomogeneity is found, the computer subsystem(s) may cross-check the rest of the care area groups (types and/or instances) to see if this learning should be applied to them as well, e.g., apply the learned rule to a sample layout from each of the other care area groups.

In any of the embodiments described herein, the care area (and other care areas) for which the steps are performed may be generated by sub-dividing initial care areas that are bigger than a predetermined size. The predetermined size may be determined based on the width of the point spread function (PSF) of the output acquisition subsystem. For example, if (in a hypothetical case) the output acquisition subsystem has a PSF of about 200 nm, then any initial care areas that are larger than 200 nm×200 nm may be divided into care areas having sizes of about 200 nm×about 200 nm. The output attribute(s) may change relatively slowly within a care area having such a size, which is why such a size may be attractive for use in the embodiments described herein. Of course, care areas that are smaller than the PSF could be used with the caveat that overtraining of the care areas may occur.

In another embodiment, the computer subsystem(s) are configured for generating another care area for the specimen based on the design, performing the determining and separating steps for the other care area, identifying the different care area sub-groups for the care area and the other care area containing a pattern having a measure of similarity above a predetermined threshold and having statistically similar values of the one or more output attributes, and combining the multiple instances of the care area and the other care area in the identified different care area sub-groups into a single care area group.

For example, as described further herein, the computer subsystem(s) may perform the determining step (the noise collection setup step) for one or more care area types. The computer subsystem(s) may determine the output attribute(s) (e.g., noise measure) per care area from a single die or multiple dies. The output attribute(s) may include mean of median (context) and mean of diff (noise) or any other output attributes described herein, e.g., depending on the defect detection method that will be used with the care areas. In this example, two attributes are being determined per care area, one is median and one is diff. If a care area has just one pixel, then determining the median and diff will suffice. However, if a care area has multiple pixels (e.g., 3 pixels by 3 pixels), then there will be multiple medians (e.g., 9) and multiple diffs (e.g., 9). To reduce this data to only two attributes, the computer subsystem(s) may determine the mean of the medians and the mean of the diffs and use those values as the one or more output attributes for the embodiments described herein. Other functions may also be used for data reduction like min, max, mode, median, standard deviation, etc. In addition, more than two attribute values may be determined per care area instance, but the number of attribute values will be different and will depend on the size of the care area, which may be unacceptable for a clustering algorithm, and the clustering algorithm will suffer from the increase of dimensionality.

The computer subsystem(s) may perform the separating step by aggregating noise measures from all care area instances per care area type and run unsupervised grouping to further subdivide care area types to sub-care area types. Optionally, the computer subsystem(s) may combine sub-care area types from different care area types based on similarity of noise/context measure. In this manner, the embodiments described herein can generate noise pure care area group segmentation.

In an additional embodiment, the care area is one of multiple care areas for the POI, and generating the care area includes identifying different instances of the POI in the design, determining design context of the different instances of the POI in the design, separating the different instances having different design contexts into different groups, and assigning one of the different groups to the care area. For example, the one or more computer subsystem(s) may be configured for what is referred to herein as "care area super-segmentation" in which instances of a care area are segmented into different groups of the care area instances based on design context. In this context, "care areas" include multiple instances of a POI, some of which have different design contexts. Those multiple instances may then be separated based on the different design contexts, and the "care area" for which other steps described herein is performed includes a portion of all of those multiple POI instances having only the same design context. Therefore, the "care area" for which other steps described herein are performed may be a care area group resulting from super-segmentation. Care area super-segmentation may be performed offline.

In some instances, design based grouping may be used to further sub-divide instances of a POI. For example, based on the design context of the different instances of the POI in the design, design based grouping may be performed to separate the instances of the POI into different groups, each corresponding to one of the different design contexts.

Super-segmentation, or vicinity-aware grouping, separates care area instances for a POI type based on the design context of each care area instance. The size of the design context area considered for this purpose can vary depending on the systematic error under analysis. In one embodiment, super-segmentation along with high-resolution pattern fidelity measurements are used to identify systematic lithography problems, in which case the design context for super-segmentation would typically include areas within the lithography optical system PSF of the care area. In another embodiment, super-segmentation along with difference image noise measurements are used to optimize image segmentation for optical defect inspection, in which case the design context for super-segmentation would typically include areas within the inspection optical system PSF of the care area.

Figure 9:
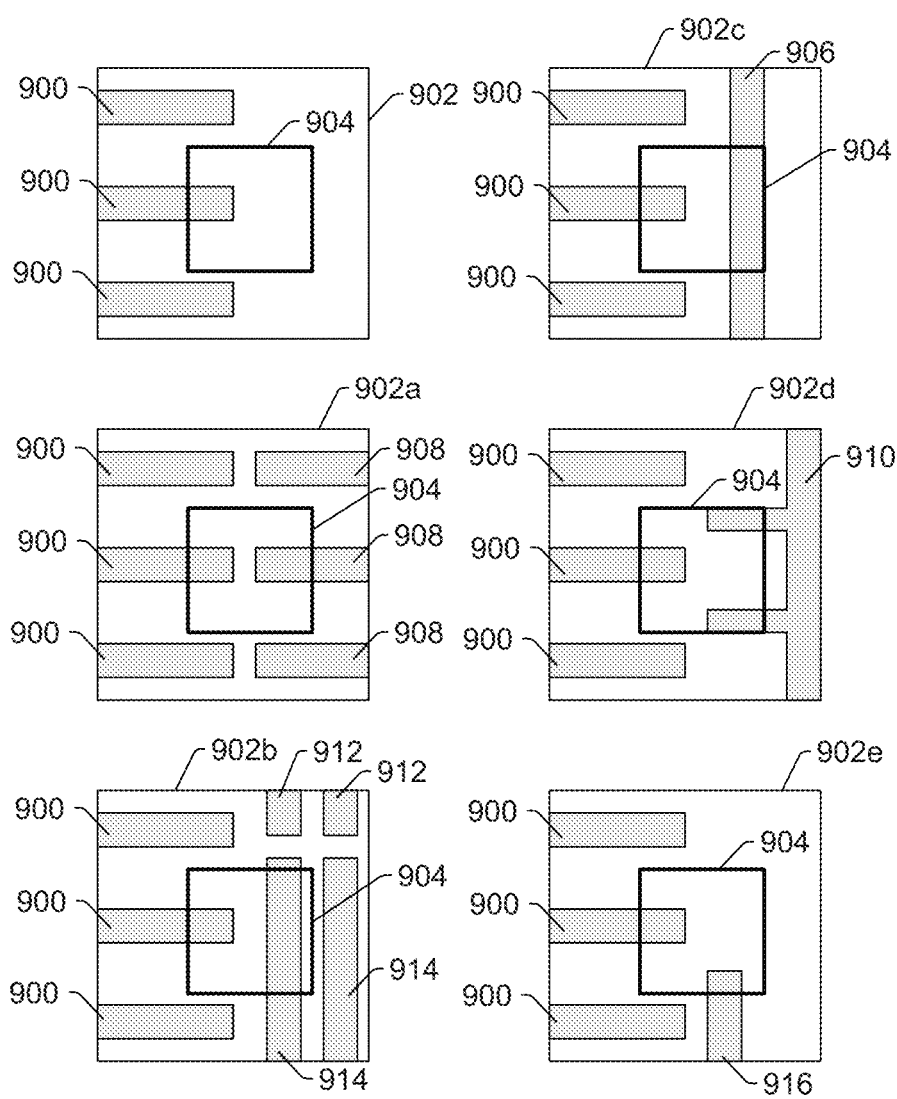
FIG. 9 is a schematic diagram illustrating a plan view of one example of different instances of a pattern of interest in a design having different design contexts.

To illustrate the concept, consider the patterns shown in FIG. 9. FIG. 9 shows instance 902 of a care area generated for a POI contained in box 904. In instance 902, there are three patterned features 900, which are lines or portions of lines horizontally oriented. The line end of the middle patterned feature is the POI contained in box 904.

As shown in FIG. 9, different instances of the POI have different design contexts. In particular, instances 902a, 902b, 902c, 902d, and 902e all have different design contexts proximate the POI. In instance 902a, the design context includes three horizontally oriented patterned features 908, which include lines or portions of lines and which are not included in instance 902. In instance 902b, the design context includes multiple vertically oriented patterned features including patterned features 912 and 914 having different dimensions. In instance 902c, the design context includes patterned feature 906, which may be a line or a portion of a line, oriented in the vertical direction. In instance 902d, the design context includes patterned feature 910 that is an irregular polygon. In instance 902e, the design context includes patterned feature 916, which may be a line or a portion of a line, oriented in the vertical direction.

As shown in FIG. 9, therefore, the design context around the POI is different in each shown instance, and we know from experience that differences like this can contribute to systematic background noise differences. In this manner, due to the differences between the design contexts shown in the different care areas, the output attribute(s) determined for the different care areas may be different even though they all are technically care areas for the same POI. For example, the shape, size, orientation, proximity to the POI, etc. of the design context can have an effect on the output generated for the care areas. Therefore, different design contexts can affect the output generated for the care areas in different ways.

In one such embodiment, separating the different instances is performed using geometric hashing. For example, super-segmentation may use a geometric hashing algorithm to create design context pure care area groups. The initial care areas (input to the geometric hashing algorithm) may be created using current best known methods using rules based searches and pattern searches. Therefore, the initial care areas may be user-defined care areas and design-based. Based on those initial care areas and the design, the initial care areas may be super-segmented offline using geometric hashing. For each care area, the computer subsystem(s) may compute a geometric hashcode. Care area instances for the same POI with the same hashcode will have the same design context, and care area instances for the same POI with different hashcodes will have different design contexts. Therefore, there is a one-to-one mapping between geometric hashcodes and groups of care area instances for one POI. The resultant care area groups are therefore design context pure. The computer subsystem(s) may store a care area group ID associated with each care area instance.

In another such embodiment, the computer subsystem(s) are configured for determining the one or more output attributes for multiple instances of another of the multiple care areas on the specimen and combining one or more of the multiple instances of the care area and one or more of the multiple instances of the other of the multiple care areas into a single care area group when the one or more of the multiple instances of the care area and the other of the multiple care areas have statistically the same values of the one or more output attributes. This care area characterization and grouping may be performed online. Data collection for care area optimization is a new type of scan that collects different data. Specifically, instead of collecting defects like a typical defect detection scan, care area optimization collects attributes/statistics about each care area in each job or frame. A characterization schema—data (events, event attributes, and job attributes) to collect per care area group, per job—may be created by the one or more computer subsystems. The computer subsystem(s) may also couple this schema with a grouping algorithm. The computer subsystem(s) may then compute care area optimization attributes per care area group, per frame or job. The results of such computations may be a database with data per care area group, per job as specified by the grouping algorithm schema. In addition, the one or more computer subsystems may create a database with care area group statistics/attribute columns, and the database schema may be determined by lookup based on scan type and use case parameters including inspection parameter flag. These statistics are used to group care areas for subsequent defect detection scans. For example, for MDAT, the computer subsystem(s) may assign care area groups to sensitivity regions. An input to the grouping step may be an upper limit on the number of care area groups that are allowed to be generated. The results of the grouping step may therefore be care areas optimized (care areas grouped optimally) for inspection.

The computer subsystem(s) are configured for selecting a parameter of an inspection recipe for the specimen based on the different care area sub-groups such that the different care area sub-groups having the statistically different values of the output attribute(s) are inspected with different values of the parameter when the inspection recipe is performed for the specimen. For example, as described herein, noise behavior may vary across any one specimen (i.e., as a function of position on a single specimen) and from specimen to specimen. Such noise behavior may be determined in both initial setup and in run. For example, variation across the specimen can be captured and analyzed on a training specimen. In addition, as described herein, the computer subsystem(s) may determine the output attribute(s) for different care area instances (and optionally across any one care area instance) by collecting data or output for a training to specimen during inspection recipe creation and for the specimen that is being inspected at run time (i.e., a runtime, test, or inspection specimen). In this manner, specimen-to-specimen variations can be handled by spatially (context) dynamic noise returning on each specimen.

Alternatively, the computer subsystem(s) may handle specimen-to-specimen variations by building up multi-specimen models with sufficient margins around the noise floor. In one such example, if only the output attribute(s) for care area instances in a local area on a specimen are collected and analyzed, the output attribute(s) may indicate a well behaved care area. However, if the output attribute(s) for the care area instances are collected and analyzed across the specimen, the output attribute(s) may show a different behavior. The same may be true if the output attribute(s) for the care area instances are collected and analyzed for multiple specimens. The computer subsystem(s) may handle variation from specimen-to-specimen without performing the determining step described herein for the runtime specimen by generating a model that performs the separating step based on prior results generated for other specimens and inputting any pre-scan or pre-map data that the inspection recipe would otherwise generate for the runtime specimen to the model. Based on the pre-scan or pre-map data, which may indicate how similar or different the output attribute(s) of the run-time specimen are to the output attribute(s) of the prior specimens, the model may adjust the care area sub-groups and/or sub-care areas.

In one embodiment, the different values of the parameter of the inspection recipe include different sensitivities of a defect detection method used in the inspection recipe to detect defects on the specimen. The different sensitivities of the defect detection method may be set by a sensitivity with which defects are detected from the output generated by the output acquisition subsystem for the specimen. Such a sensitivity may be controlled by, for example, one or more thresholds used to separate the output into output that corresponds to defects and output that does not correspond to defects. In addition or alternatively, determining the parameter of the inspection recipe may include optimizing the threshold per care area type to obtain a desired number of defects. Such a sensitivity may be set using a capture rate ("cap rate" or "caprate") for the different care area sub-groups or different sub-care areas. Configuring the defect detection method based on a predetermined caprate avoids the need to manually tune defect detection thresholds. In addition, manual tuning of defect detection thresholds may be prohibitive due to the substantially large number of care area sub-groups and/or sub-care areas that may be generated by the embodiments described herein. Instead, the inspection goal (e.g., desired nuisance rate+desired DOI caprate per DOI type) can be specified. Defect detection thresholds may also be determined automatically using a DOI-to-care area compatibility matrix, such as that described further herein.

The inspection recipe parameter selection as described herein may include a number of other considerations that are not necessarily needed for purely design based care areas. For example, the embodiments described herein will most likely increase the number of care area groups, sub-groups, etc. in the inspection recipe. As the number of different care areas groups, care area subgroups, or sub-care areas increases, the number of any one type of care area group, sub-group, or sub-care area will decrease. As a result, data sufficiency for defect detection may be a challenge in some instances (e.g., for test minus reference statistical detection). Therefore, the type of defect detection method that is used for any one type of care area may be evaluated and/or modified based on the number of instances of that one type of care area on the specimen generated by the embodiments described herein. For example, as a consequence of fewer instances of a care area type, the overall solution may require data accumulation across jobs for defect detection. In addition, as the number of care area types increases thereby reducing the number of care area instances of any one care area type, finding DOI examples for training and/or tuning of the inspection recipe can be a challenge. The likelihood of finding a sufficient number of DOI examples on a specimen for training and/or tuning can be increased using the systematic defect detection described further herein.

The inspection recipe parameter selection as described herein may also include selecting a value for any one or more parameters of the inspection recipe that can be modified. For example, once the threshold(s) or sensitivity(ies) are determined as described herein, the inspection recipe may be run, the defects detected by the inspection run may be reviewed, and the results of the defect review may be used to set up a nuisance event filter for the inspection recipe. Therefore, one or more parameters of the inspection recipe may be selected thereby creating an intermediate recipe and then one or more other parameters of the intermediate inspection recipe may be selected thereby creating a production recipe.

The parameter of the inspection recipe that is selected as described herein may also include not just output processing parameters (defect detection, nuisance filtering, etc.) but also or alternatively output generation parameters (any parameters of any hardware elements of the output acquisition subsystem such as illumination and/or detection angle(s), polarization(s), wavelength(s), etc.). These parameters may be selected in any suitable manner based on information for the care areas generated by the separating step and information for the output attribute(s) determined for the care areas generated by the separating step. Although it may be more efficient to handle differences in the care areas generated by the separating step in the output processing parameter(s), it may be attractive to handle some of these differences in the output generation hardware parameters. If that is the case, one way to scan different care areas with different output generation hardware parameters may be to perform different scans for different subsets of the care areas. In any case, the embodiments described herein are not limited in the inspection recipe parameter that can be selected based on the care areas generated by the separating step.

In another embodiment, the POI has a first POI type, another care area defines another portion of the design containing another POI having a second POI type, and the generating, determining, separating, and selecting steps described herein are performed separately for the care area and the other care area. In this manner, different care area types (corresponding to different POI types) may be processed separately (in the steps performed by the one or more computer subsystems). However, each of the inspection recipe parameters selected separately and independently for the different care area types may be combined into a single inspection recipe that is performed for the specimen. In addition, the selecting the inspection recipe parameter step may be performed for multiple care area types at the same time to thereby optimize the inspection recipe parameter for multiple care area types corresponding to different POI types. In any case, different care area types may be processed separately to determine the output attribute(s) independently for different care area types and to separate the care area types independently of each other.

In an additional embodiment, the inspection recipe includes a defect detection method applied to the output generated by the output acquisition subsystem for the specimen to thereby detect defects on the specimen, and the one or more computer subsystems are configured for identifying which of the defects are systematic defects based on positions of the defects determined with respect to the design for the specimen. "Systematic defects" as that term is used herein (and is used commonly in the art) refers to defects that are not random. Instead, systematic defects are generally present and detected at the same pattern or patterned feature on a specimen in a relatively large number of instances and/or at a relatively high frequency (a relatively high number of defects per number of pattern or patterned feature instances).

Systematic DOI susceptibility will likely cross care area boundaries. In particular, care areas that are design based and DOI based are both generated based on the design (e.g., design based care areas are based on a POI and knowledge of where in the design that POI is expected, DOI based care areas are based on a DOI and knowledge of where in the design that DOI is expected). In contrast, unlike purely design-based care areas, DOI based care areas are also based on DOI information. Nevertheless, multiple instances of one DOI type may exist in multiple care area types generated by the embodiments described herein (e.g., in multiple care area sub-groups and/or multiple sub-care areas), and/or multiple care area types generated by the embodiments described herein (e.g., multiple care area sub-groups and/or multiple sub-care areas) may be susceptible to the same type of DOI. For example, the same pattern or patterned feature may be occurring in multiple care areas (i.e., care areas having different types), which may then lead to the same DOI being detected in different care areas having different types. Therefore, DOI types that have some geometric dependency will likely occur in multiple care area types (instances of different care area types or different sub-care areas) and enabling identification of such DOI types may be critical for the embodiments described herein.

The across care area DOI susceptibility may be considered during setup. For example, the computer subsystem(s) may determine a DOI-to-care area compatibility matrix by running DOI-specific rules on sample design per care area type. In the first step, care areas are created based on failure mechanisms (either rule-based or hot spot based). In the second step, those care areas are further split up according to their noise characteristics. Such hierarchical formation of noise-based care areas provides for natural mapping of DOIs into care areas (just group noise-based splits back into its original care area type).

In another example, rather than determining the presence of a DOI or a systematic DOI (i.e., a defect that presents in a systematic way on the specimen) based on defect detection results as a function of care area as is currently performed, the care area in which defects are detected may not be used for systematic defect identification (or may not be used alone in systematic defect identification). Instead, the position of the detected defects with respect to the design may be used to determine which detected defects are systematic and/or DOI.

Such systematic defect detection may be performed in a number of different ways. For example, the design context of each of the different defects may be compared to determine which of the detected defects have the same design context. The design context may be one or more patterned features within a predetermined area surrounding the defect. Therefore, the design contexts of the detected defects may be different than the POIs for which the care areas are generated and/or the design context of the POIs for which the care areas are generated. Defects that are located in the same design context and are greater in number or frequency than some predetermined threshold may be identified as systematic defects.

The design context may be identified from the output generated by the output acquisition subsystem (e.g., in the images of the specimen). Alternatively, the design context may be identified in the design for the specimen. For example, the design coordinates of the detected defects may be determined in a number of different ways (e.g., based on alignment of the output generated by the output acquisition subsystem for the specimen to the design for the specimen), and the design coordinates of the detected defects may be used to determine the design context at the design coordinates. In this manner, unlike previous care area based methods for systematic defect detection, the embodiments described herein may not use care area information for systematic defect detection instead relying on the patterns or patterned features corresponding to the detected defect locations for systematic defect identification.

In one embodiment, the computer subsystem(s) are configured for performing the inspection recipe on multiple specimens and monitoring variation in the one or more output attributes determined for the multiple specimens as a function of specimen by determining the variation and comparing the variation to a predetermined allowable variation. For example, the computer subsystem(s) may be configured to gather contrast and noise statistics per care area type on every specimen. The computer subsystem(s) may also be configured for monitoring the variation of the contrast and noise for one or more care area types, e.g., critical care area types (i.e., care area types with critical geometries such as patterned features having minimum width, spacing, etc.), from specimen-to-specimen. The inspection recipe may be performed on the multiple specimens in any suitable manner known in the art. The output attribute(s) whose variation is monitored from specimen-to-specimen may be the same output attribute(s) determined in the embodiments described herein although that is not required (e.g., different output attribute(s) may be used for the monitoring than were used for the determining step). The predetermined allowable variation may be determined and/or set in any suitable manner. For example, a user may set the predetermined allowable variation based on how critical a care area type is, how much variation is tolerable to or expected in the fabrication process performed on the specimen prior to inspection, how much variation is expected in the normal performance of the inspection recipe, and the like.

In one such embodiment, the computer subsystem(s) are configured for determining a confidence of results produced by performing the inspection recipe on one of the multiple specimens based on a comparison of the variation determined after the inspection recipe is performed on the one of the multiple specimens and the predetermined allowable variation. For example, if a care area type exceeds an allowable variation, the one or more computer subsystem(s) may use this information to generate an alarm that this specimen/care area type is sufficiently different that there cannot be relatively high confidence in the sensitivity or defect detection results (e.g., Pareto) accuracy. The confidence may be determined based on how much the variation determined for a specimen exceeds the predetermined allowable variation (e.g., as the difference between the variation and the predetermined allowable variation increases, the confidence decreases). The correlation between confidence and difference between variation and predetermined allowable variation may be determined in any suitable manner. Each time the inspection recipe is performed on a specimen, the variation determined for the specimen may be compared to the predetermined allowable variation, a confidence may be determined based on results of the comparison, and an alarm may be generated if that confidence is below a predetermined confidence threshold.

In another such embodiment, the computer subsystem(s) are configured for altering one or more parameters of a defect review process performed on one of the multiple specimens based on results of comparing the variation to the predetermined allowable variation. For example, if a care area type exceeds an allowable variation, the one or more computer subsystem(s) may use the detected shift to increase the defect review (e.g., scanning electron microscope (SEM)) budget for this specimen/care area type (if defects are predicted to be more buried in the noise floor). In this manner, by altering the parameter(s) of defect review as described above, more defects can be reviewed in a care area type exhibiting a shift, which can be used to modify the inspection results for the care area type and/or provide more information for determining why the shift occurred.

Defect review typically involves re-detecting defects detected as such by an inspection process and generating additional information about the defects at a higher resolution using either a high magnification optical system or a scanning electron microscope (SEM). Defect review is therefore performed at discrete locations on the specimen where defects have been detected by inspection. The higher resolution data for the defects generated by defect review is more suitable for determining attributes of the defects such as profile, roughness, more accurate size information, etc. Since the defect review is performed for defects detected on the specimen by inspection, the parameters used for defect review at a location of a detected defect may also be determined based on attributes of the defects determined by the inspection process.

In an additional such embodiment, the one or more computer subsystems are configured for, when the variation generated for one of the multiple specimens exceeds the predetermined allowable variation, altering one or more parameters of the inspection recipe performed for the care area on the one of the multiple specimens. For example, if a care area type exceeds an allowable variation, the one or more computer subsystem(s) may remove any nuisance event filter for this affected care area type. In this manner, all events detected for the care area type that exceeds the allowable variation can be saved for further analysis (e.g., to use all of the detected events to determine why the shift in the care area occurred, to sample a higher number of the detected events to determine which events are nuisances and which are actual defects, etc.).

In one such embodiment, the computer subsystem(s) are configured for altering one or more parameters of a defect review process performed for the care area on the one of the multiple specimens. For example, if a care area type exceeds an allowable variation, the one or more computer subsystem(s) may remove any nuisance event filter for this affected care area type and perform adaptive sampling and massive review to determine defect detection results (e.g., Pareto) for this care area type. In particular, as described above, all of the events detected in a care area type exceeding the allowable variation can be saved rather than nuisance filtered. An adaptive sampling method may then be performed for the care area type. The sampling may be adaptive in that it is adapted to the events actually detected in the care area type rather than set prior to the inspection recipe run. The massive review performed for the care area type may then be performed based on the sample generated adaptively and may be massive in that it may review every sampled event or at least a substantial portion (e.g., 80% or 90%) of the sampled events. In this manner, the actual defects detected in the care area type can be accurately separated from the nuisance events detected in the care area type despite the shift in the care area type output attribute(s).

In another embodiment, the computer subsystem(s) are configured for, when the variation generated for one of the multiple specimens exceeds the predetermined allowable variation, running a defect discovery recipe for the one of the multiple specimens. For example, if a care area type exceeds an allowable variation, the one or more computer subsystem(s) may automatically run a defect discovery recipe (assumption being that the current recipe cannot run effectively on this specimen). A "defect discovery recipe," as that term is used herein, can be generally defined as a recipe in which a scan is performed on a specimen and a defect detection method is performed using a hot threshold (i.e., a threshold set at or in the noise floor of the output). In this manner, the defect discovery recipe may generate a massive number of detected events, which can then be analyzed (e.g., by systematic defect detection and/or review and adaptive sampling) to identify which of the detected events are actual defects or DOI and which are nuisances. In this manner, if a new DOI type is present on a specimen and thereby skewing the results of the inspection recipe, the new DOI type can be identified by the embodiments described herein.

In addition, results of the defect discovery recipe can be used to further alter one or more parameters of the inspection recipe that was run on the multiple specimens. For example, if the defect discovery recipe shows that there are no new DOIs in the care area type having an abnormal variation but instead the variation is due to nuisance events and/or a variation in the noise source in the care area type, the inspection recipe whose parameter was selected as described herein can be modified in the same parameter and/or one or more other parameter values.

In another embodiment, a portion of one of the multiple instances of the care area on the specimen has an area that is spatially coincident with an area of a portion of an instance of another care area on the specimen, the care area and the other care area have different priorities, and the one or more computer subsystems are configured for determining variation in the one or more output attributes determined for the multiple instances of the care area on the specimen as a function of position of the multiple instances on the specimen and determining an order for the care area and the other care area in the area based on the determined variation. Such an embodiment is therefore particularly suitable for handling process variation within specimen.

In this embodiment, the determining step may include gathering contrast and noise statistics by care area type for every job. The one or more computer subsystems can also monitor contrast and noise of critical care area types across a single specimen. Currently, care area types have an order that removes inspected area from care area types that have pixels in common with higher priority care area types. Put simply, the areas that overlap are removed from the lower priority care area. There may be no overall "correct" way to order care areas. For example, at the edge of a specimen, the correct solution may be care area 1 overlapped with care area 2. However, in the center of the specimen, the correct solution may be care area 2 overlapped with care area 1. Allowing a noisier care area to effectively remove inspection area from a lower noise care area can negatively impact sensitivity. By measuring how contrast and noise shift across the specimen, the computer subsystem(s) can make a run-time decision on the best order for care areas.

In an additional embodiment, the one or more computer subsystems are configured for selecting a parameter of a metrology recipe for the specimen based on the different care area sub-groups such that the different care area sub-groups having the statistically different values of the one or more output attributes are measured with different values of the parameter of the metrology recipe. For example, the embodiments described herein are not limited to setting up care areas for just inspection. Instead or additionally, the embodiments may be used for other processes like metrology. In such embodiments, the generating, determining, and separating steps may be performed as described herein, and the parameter of the metrology recipe that is selected may include any suitable parameter of the metrology recipe including hardware and software parameters. In this manner, the parameter(s) of the metrology recipe can be varied from care area to care area based on the care areas generated by the separating step described herein.

Metrology processes are used at various steps during a semiconductor manufacturing process to monitor and control the process. Metrology processes are different than inspection processes in that, unlike inspection processes in which defects are detected on a specimen, metrology processes are used to measure one or more characteristics of the specimen that cannot be determined using currently used inspection tools. For example, metrology processes are used to measure one or more characteristics of a specimen such as a dimension (e.g., line width, thickness, etc.) of features formed on the specimen during a process such that the performance of the process can be determined from the one or more characteristics. In addition, if the one or more characteristics of the specimen are unacceptable (e.g., out of a predetermined range for the characteristic(s)), the measurements of the one or more characteristics of the specimen may be used to alter one or more parameters of the process such that additional specimens manufactured by the process have acceptable characteristic(s).

Metrology processes are also different than defect review processes in that, unlike defect review processes in which defects that are detected by inspection are re-visited in defect review, metrology processes may be performed at locations at which no defect has been detected. In other words, unlike defect review, the locations at which a metrology process is performed on a specimen may be independent of the results of an inspection process performed on the specimen. In particular, the locations at which a metrology process is performed may be selected independently of inspection results. In addition, since locations on the specimen at which metrology is performed may be selected to independently of inspection results, unlike defect review in which the locations on the specimen at which defect review is to be performed cannot be determined until the inspection results for the specimen are generated and available for use, the locations at which the metrology process is performed may be determined before an inspection process has been performed on the specimen.

In another embodiment, the computer subsystem(s) are configured for generating a database comprising results of the determining, separating, and selecting steps and selecting a parameter of an inspection recipe for another specimen based on a care area generated for the other specimen and the database. The database may have any suitable format described herein. In addition, the database may be configured and generated as described further herein and may include any of the information and/or results generated by any of the steps described herein. As the steps are performed for other specimen(s), the results of the steps performed for the other specimen(s) may be added to the database thereby accumulating the results across specimens.

Selecting a parameter of an inspection recipe for another specimen may therefore be performed using the database with or without other steps described herein being performed for the other specimen. For example, the database generated by the computer subsystem(s) enable learning from specimen to specimen (and/or device to device) so that an inspection recipe for a new specimen (or device) can be optimized without going through the noise data acquisition steps described herein, which can provide a significant operational advantage. Such inspection recipe setup may also be performed as described in U.S. Pat. No. 7,676,077 to Kulkarni et al. issued on Mar. 9, 2010 and U.S. Pat. No. 7,877,722 to Duffy et al. issued on Jan. 25, 2011, which are incorporated by reference as if fully set forth herein. This embodiment may be further configured as described in these patents.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art.

After the results have been stored, the results can be accessed in the storage medium and used by any of the method or system embodiments described herein, formatted for display to a user, used by another software module, method, or system, etc. For example, the parameter of the inspection recipe selected as described herein may be used to modify the inspection recipe and store the modified inspection recipe in a storage medium. The stored, modified inspection recipe can then be used to perform inspection on the specimen and possibly other specimens of the same type. The inspection may be performed with the modified inspection recipe by the system embodiments described herein or another system. In a similar manner, a modified metrology recipe may be stored and used by the system or another system to perform metrology on the specimen or other specimens of the same design.

The embodiments described herein may be combined with other techniques and systems for specimen inspection, metrology, and other quality control processes. Examples of methods and systems that may be combined with the embodiments described herein are described in U.S. Pat. No. 7,676,077 to Kulkarni et al. issued on Mar. 9, 2010, U.S. Pat. No. 7,877,722 to Duffy et al. issued on Jan. 25, 2011, U.S. Pat. No. 8,126,255 to Bhaskar et al. issued on Feb. 28, 2012, U.S. Pat. No. 8,204,296 to Bhaskar et al. issued on Jun. 29, 2012, U.S. Pat. No. 8,611,639 to Kulkarni et al. issued Dec. 17, 2013, U.S. Pat. No. 9,183,624 to Karsenti et al. issued on Nov. 10, 2015, and U.S. Pat. No. 9,262,821 to Shifrin et al. issued on Feb. 16, 2016, and U.S. Patent Application Publication No. 2017/0059491 by Duffy et al. published on Mar. 2, 2017, each of which is incorporated by reference as if fully set forth herein. The embodiments described herein may be further configured as described in these patents and patent publication.

The embodiments described herein provide a number of advantages over previously used care area based methods and systems. For example, the embodiments described herein enable a practical means of optimizing inspection care areas for image noise segmentation. The embodiments can also group areas that are homogenous in terms of both design and noise using care areas modified based on noise data to improve the signal-to-noise ratio that can be used for identifying outlier pixels as part of the signal processing chain of the inspector. In addition, the embodiments described herein improve time-to-entitlement, particularly by offering un-precedented volume and accuracy of care area placement for the purpose of segmenting image noise to enhance net inspection sensitivity.

Additional advantages include that the care area types are no longer combined to form a limited number of regions. Instead, they are further segmented based on specimen noise and context obtained from multiple dies. The segmentation may produce care area sub-groups (in which multiple instances of the same type of care area are separated into different sub-groups) and/or sub-care areas (in which one instance of a care area is separated into different sub-care areas). The embodiments described herein, therefore, allow the care areas to be noise, context, and design pure. The embodiments described herein also allow combining different sub-groups or different sub-care areas from different care area types based on noise statistics. Therefore, the care area sub-groups and/or sub-care areas could be noise, context, and design pure. Inspection performed with the care areas that have been segmented (and optionally combined) as described herein will have improved defect detection. For example, in the case of MDAT defect detection, the MDAT cloud will be narrower thereby enhancing signal-to-noise ratio of relatively low signal DOIs. In other words, enabling sub-care area and/or care area sub-group based detection provides a narrower MDAT cloud and thus better DOI detectability. The embodiments described herein will be able to detect defects that were deep inside the noise floor in the past.

The embodiments described herein also provide an automated way of noise/context based segmentation. In addition, the embodiments described herein provide an automated way of regrouping care areas separated based on noise/context. For example, the embodiments described herein will be able to automatically 1) sub-segment care area types and/or instances and/or 2) regroup care areas segmented based on specimen and context measures. Another advantage of the embodiments described herein is, therefore, that the variability of inspection results due to manual care area selection will be eliminated. Because there is no manual care area process involved, care area segmentation/combination will be methodical and optimal. Furthermore, automation of the care area setup process by the embodiments described herein will improve detectability of relatively low signal defects significantly.

Each of the embodiments of each of the systems described above may be combined together into one single embodiment.

Another embodiment relates to a computer-implemented method for setting up inspection of a specimen with design and noise based care areas. The method includes the generating, determining, separating, and selecting steps described above.

Each of the steps of the method may be performed as described further herein. The method may also include any other step(s) that can be performed by the output acquisition subsystem and/or computer subsystem(s) or system(s) described herein. The generating, determining, separating, and selecting steps are performed by one or more computer systems, which may be configured according to any of the embodiments described herein. In addition, the method described above may be performed by any of the system embodiments described herein.

Figure 10:
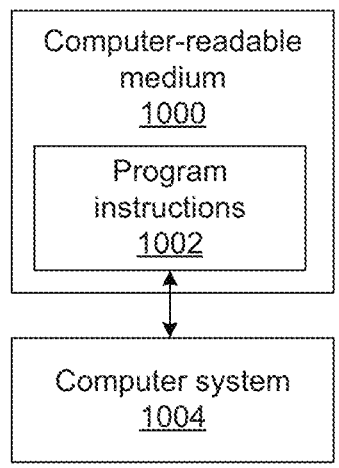
FIG. 10 is a block diagram illustrating one embodiment of a non-transitory computer-readable medium storing program instructions for causing a computer system to perform a computer-implemented method described herein.

An additional embodiment relates to a non-transitory computer-readable medium storing program instructions executable on a computer system for performing a computer-implemented method for setting up inspection of a specimen with design and noise based care areas. One such embodiment is shown in FIG. 10. In particular, as shown in FIG. 10, non-transitory computer-readable medium 1000 includes program instructions 1002 executable on computer system 1004. The computer-implemented method may include any step(s) of any method(s) described herein.

Program instructions 1002 implementing methods such as those described herein may be stored on computer-readable medium 1000. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 1004 may be configured according to any of the embodiments described herein.

Further modifications and alternative embodiments of various aspects of the invention will be apparent to those skilled in the art in view of this description. For example, methods and systems for setting up inspection of a specimen with design and noise based care areas are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured for setting up inspection of a specimen with design and noise based care areas, comprising:
    an output acquisition subsystem comprising at least an energy source and a detector, wherein the energy source is configured to generate energy that is directed to a specimen, and wherein the detector is configured to detect energy from the specimen and to generate output responsive to the detected energy; and
    one or more computer subsystems configured for:
        generating a care area for the specimen based on a design for the specimen, wherein the care area defines a portion of the design containing a pattern of interest;
        determining one or more output attributes for multiple instances of the care area on the specimen, wherein the one or more output attributes are determined from the output generated by the output acquisition subsystem for the multiple instances;
        separating the multiple instances of the care area on the specimen into different care area sub-groups based on the one or more output attributes such that the different care area sub-groups have statistically different values of the one or more output attributes; and
        selecting a parameter of an inspection recipe for the specimen based on the different care area sub-groups such that the different care area sub-groups having the statistically different values of the one or more output attributes are inspected with different values of the parameter when the inspection recipe is performed for the specimen.

2. The system of claim 1, wherein at least one of the one or more output attributes is a noise attribute.

3. The system of claim 1, wherein the output from which the one or more output attributes are determined is output generated by the detector for the specimen.

4. The system of claim 1, wherein the output from which the one or more output attributes are determined is output generated with more than one mode of the output acquisition subsystem for the specimen.

5. The system of claim 1, wherein generating the care area for the specimen based on the design comprises searching the design for the pattern of interest.

6. The system of claim 1, wherein the different values of the parameter of the inspection recipe comprise different sensitivities of a defect detection method used in the inspection recipe to detect defects on the specimen.

7. The system of claim 1, wherein the pattern of interest has a first pattern of interest type, wherein another care area defines another portion of the design containing another pattern of interest having a second pattern of interest type, and wherein said generating, determining, separating, and selecting are performed separately for the care area and the other care area.

8. The system of claim 1, wherein the one or more computer subsystems are further configured for determining the one or more output attributes as a function of position within the care area for one or more of the multiple instances of the care area on the specimen and separating the care area into two or more different sub-care areas based on the one or more output attributes as the function of the position such that the two or more different sub-care areas have statistically different values of the one or more output attributes.

9. The system of claim 1, wherein the inspection recipe comprises a defect detection method applied to the output generated by the output acquisition subsystem for the specimen to thereby detect defects on the specimen, and wherein the one or more computer subsystems are further configured for identifying which of the defects are systematic defects based on positions of the defects determined with respect to the design for the specimen.

10. The system of claim 1, wherein the one or more computer subsystems are further configured for selecting the multiple instances of the care area for which the one or more output attributes are determined by sampling fewer than all of the multiple instances of the care area on the specimen, wherein the sampling is performed based on expected die level variation in the one or more output attributes, and wherein the one or more computer subsystems are further configured for determining actual die level variation in the one or more output attributes for the care area based on the determined one or more output attributes.

11. The system of claim 1, wherein the one or more computer subsystems are further configured for selecting the multiple instances of the care area for which the one or more output attributes are determined by sampling fewer than all of the multiple instances of the care area on the specimen, wherein the sampling is performed based on expected specimen level variation in the one or more output attributes, and wherein the one or more computer subsystems are further configured for determining actual specimen level variation in the one or more output attributes for the care area based on the determined one or more output attributes.

12. The system of claim 1, wherein generating the care area is performed using a first predetermined method, and wherein the one or more computer subsystems are further configured for generating another care area for the pattern of interest with a second predetermined method, performing the determining and separating steps for the other care area, and selecting the first or second predetermined method for generating additional care areas based on results of the determining and separating steps performed for the care area and the other care area.

13. The system of claim 1, wherein the one or more computer subsystems are further configured for modifying a method used for generating the care area by inferring one or more modified parameters for the method from statistical analysis of the one or more output attributes determined for the multiple instances.

14. The system of claim 1, wherein another care area generated for the specimen based on the design defines a different portion of the design containing a different pattern of interest, and wherein the one or more computer subsystems are further configured for determining if the determining and separating steps are performed for the other care area based on results of said determining and separating performed for the care area.

15. The system of claim 1, wherein the one or more computer subsystems are further configured for generating another care area for the specimen based on the design, performing the determining and separating steps for the other care area, identifying the different care area sub-groups for the care area and the other care area containing a pattern having a measure of similarity above a predetermined threshold and having statistically similar values of the one or more output attributes, and combining the multiple instances of the care area and the other care area in the identified different care area sub-groups into a single care area group.

16. The system of claim 1, wherein the care area is one of multiple care areas for the pattern of interest, and wherein generating the care area comprises identifying different instances of the pattern of interest in the design, determining design context of the different instances of the pattern of interest in the design, separating the different instances having different design contexts into different groups, and assigning one of the different groups to the care area.

17. The system of claim 16, wherein separating the different instances is performed using geometric hashing.

18. The system of claim 16, wherein the one or more computer subsystems are further configured for determining the one or more output attributes for multiple instances of another of the multiple care areas on the specimen and combining one or more of the multiple instances of the care area and one or more of the multiple instances of the other of the multiple care areas into a single care area group when the one or more of the multiple instances of the care area and the other of the multiple care areas have statistically the same values of the one or more output attributes.

19. The system of claim 1, wherein the one or more computer subsystems are further configured for performing the inspection recipe on multiple specimens and monitoring variation in the one or more output attributes determined for the multiple specimens as a function of specimen by determining the variation and comparing the variation to a predetermined allowable variation.

20. The system of claim 19, wherein the one or more computer subsystems are further configured for determining a confidence of results produced by performing the inspection recipe on one of the multiple specimens based on a comparison of the variation determined after the inspection recipe is performed on the one of the multiple specimens and the predetermined allowable variation.

21. The system of claim 19, wherein the one or more computer subsystems are further configured for altering one or more parameters of a defect review process performed on one of the multiple specimens based on results of comparing the variation to the predetermined allowable variation.

22. The system of claim 19, wherein the one or more computer subsystems are further configured for, when the variation generated for one of the multiple specimens exceeds the predetermined allowable variation, altering one or more parameters of the inspection recipe performed for the care area on the one of the multiple specimens.

23. The system of claim 22, wherein the one or more computer subsystems are further configured for altering one or more parameters of a defect review process performed for the care area on the one of the multiple specimens.

24. The system of claim 19, wherein the one or more computer subsystems are further configured for, when the variation generated for one of the multiple specimens exceeds the predetermined allowable variation, running a defect discovery recipe for the one of the multiple specimens.

25. The system of claim 1, wherein a portion of one of the multiple instances of the care area on the specimen has an area that is spatially coincident with an area of a portion of an instance of another care area on the specimen, wherein the care area and the other care area have different priorities, and wherein the one or more computer subsystems are further configured for determining variation in the one or more output attributes determined for the multiple instances of the care area on the specimen as a function of position of the multiple instances on the specimen and determining an order for the care area and the other care area in the area based on the determined variation.

26. The system of claim 1, wherein the one or more computer subsystems are further configured for selecting a parameter of a metrology recipe for the specimen based on the different care area sub-groups such that the different care area sub-groups having the statistically different values of the one or more output attributes are measured with different values of the parameter of the metrology recipe.

27. The system of claim 1, wherein the specimen comprises a wafer.

28. The system of claim 1, wherein the specimen comprises a reticle.

29. The system of claim 1, wherein the energy directed to the specimen comprises light, and wherein the energy detected from the specimen comprises light.

30. The system of claim 1, wherein the energy directed to the specimen comprises electrons, and wherein the energy detected from the specimen comprises electrons.

31. The system of claim 1, wherein the energy directed to the specimen comprises ions.

32. The system of claim 1, wherein the one or more computer subsystems are further configured for generating a database comprising results of the determining, separating, and selecting steps and selecting a parameter of an inspection recipe for another specimen based on a care area generated for the other specimen and the database.

33. A non-transitory computer-readable medium, storing program instructions executable on a computer system for performing a computer-implemented method for setting up inspection of a specimen with design and noise based care areas, wherein the computer-implemented method comprises:

generating a care area for a specimen based on a design for the specimen, wherein the care area defines a portion of the design containing a pattern of interest;

determining one or more output attributes for multiple instances of the care area on the specimen, wherein the one or more output attributes are determined from output generated by an output acquisition subsystem for the multiple instances, wherein the output acquisition subsystem comprises at least an energy source and a detector, wherein the energy source is configured to generate energy that is directed to the specimen, and wherein the detector is configured to detect energy from the specimen and to generate the output responsive to the detected energy;

separating the multiple instances of the care area on the specimen into different care area sub-groups based on the one or more output attributes such that the different care area sub-groups have statistically different values of the one or more output attributes; and selecting a parameter of an inspection recipe for the specimen based on the different care area sub-groups such that the different care area sub-groups having the statistically different values of the one or more output attributes are inspected with different values of the parameter when the inspection recipe is performed for the specimen.

34. A computer-implemented method for setting up inspection of a specimen with design and noise based care areas, comprising:

generating a care area for a specimen based on a design for the specimen, wherein the care area defines a portion of the design containing a pattern of interest;

determining one or more output attributes for multiple instances of the care area on the specimen, wherein the one or more output attributes are determined from output generated by an output acquisition subsystem for the multiple instances, wherein the output acquisition subsystem comprises at least an energy source and a detector, wherein the energy source is configured to generate energy that is directed to the specimen, and wherein the detector is configured to detect energy from the specimen and to generate the output responsive to the detected energy;

separating the multiple instances of the care area on the specimen into different care area sub-groups based on the one or more output attributes such that the different care area sub-groups have statistically different values of the one or more output attributes; and selecting a parameter of an inspection recipe for the specimen based on the different care area sub-groups such that the different care area sub-groups having the statistically different values of the one or more output attributes are inspected with different values of the parameter when the inspection recipe is performed for the specimen, wherein said generating, determining, separating, and selecting are performed by one or more computer systems.

* * * * *